(12) United States Patent
Frougier et al.

(10) Patent No.: US 11,569,361 B2
(45) Date of Patent: Jan. 31, 2023

(54) NANOSHEET TRANSISTORS WITH WRAP AROUND CONTACT

(71) Applicant: INTERNATIONAL BUSINESS MACHINES CORPORATION, Armonk, NY (US)

(72) Inventors: Julien Frougier, Albany, NY (US); Ruilong Xie, Niskayuna, NY (US); Kangguo Cheng, Schenectady, NY (US); Chanro Park, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 81 days.

(21) Appl. No.: 17/247,936

(22) Filed: Dec. 31, 2020

(65) Prior Publication Data
US 2022/0208981 A1 Jun. 30, 2022

(51) Int. Cl.
*H01L 29/423* (2006.01)
*H01L 29/06* (2006.01)
(Continued)

(52) U.S. Cl.
CPC .............. *H01L 29/42392* (2013.01); *H01L 21/823418* (2013.01); *H01L 27/088* (2013.01);
(Continued)

(58) Field of Classification Search
CPC ......... H01L 29/42392; H01L 29/78696; H01L 29/0653
See application file for complete search history.

(56) References Cited

U.S. PATENT DOCUMENTS

| 8,823,059 B2 | 9/2014 | Dewey |
| 9,653,287 B2 | 5/2017 | Rodder |

(Continued)

FOREIGN PATENT DOCUMENTS

| CN | 114695350 A | 7/2022 |
| DE | 102021131415 A1 | 6/2022 |

(Continued)

OTHER PUBLICATIONS

Combined Search and Examination Report under Sections 17 and 18(3), Your Reference: DP/P49932GB, Application No. GB2117763.9, dated May 9, 2022, 6 pages.

*Primary Examiner* — Changhyun Yi
(74) *Attorney, Agent, or Firm* — L. Jeffrey Kelly

(57) ABSTRACT

An embodiment includes a method of forming a semiconductor device and the resulting device. The method may include forming a source/drain on an exposed portion of a semiconductor layer of a layered nanosheet. The method may include forming a sacrificial material on the source/drain. The method may include forming a dielectric layer covering the sacrificial material. The method may include replacing the sacrificial material with a contact liner. The semiconductor device may include a first gate nanosheet stack and second gate nanosheet stack. The semiconductor device may include a first source/drain in contact with the first nanosheet stack and a second source/drain in contact with the second nanosheet stack. The semiconductor device may include a source/drain dielectric located between the first source/drain and the second source/drain. The semiconductor device may include a contact liner in contact with the first source/drain, the second source/drain and the source/drain dielectric.

19 Claims, 12 Drawing Sheets

(51) Int. Cl.
*H01L 21/8234* (2006.01)
*H01L 27/088* (2006.01)
*H01L 29/417* (2006.01)
*H01L 29/786* (2006.01)

(52) U.S. Cl.
CPC .... *H01L 29/0665* (2013.01); *H01L 29/41733* (2013.01); *H01L 29/78696* (2013.01)

(56) References Cited

U.S. PATENT DOCUMENTS

| | | | |
|---|---|---|---|
| 9,716,158 | B1 | 7/2017 | Cheng |
| 9,837,414 | B1* | 12/2017 | Balakrishnan .... H01L 21/76895 |
| 9,842,914 | B1 | 12/2017 | Yeung |
| 10,243,060 | B2 | 3/2019 | Chao |
| 10,276,442 | B1 | 4/2019 | Xie |
| 10,361,277 | B2 | 7/2019 | Adusumilli |
| 2014/0084343 | A1 | 3/2014 | Dewey |
| 2016/0126310 | A1* | 5/2016 | Rodder ............ H01L 21/02603 438/299 |
| 2018/0068857 | A1 | 3/2018 | Adusumilli |
| 2018/0277656 | A1 | 9/2018 | Chao |
| 2019/0057867 | A1* | 2/2019 | Smith ................. H01L 29/0669 |
| 2019/0157386 | A1 | 5/2019 | Ando |
| 2019/0157420 | A1 | 5/2019 | Cheng |
| 2019/0165135 | A1 | 5/2019 | Cheng |
| 2019/0181224 | A1* | 6/2019 | Zhang ............... H01L 29/66545 |
| 2019/0295899 | A1 | 9/2019 | Seo |
| 2020/0105761 | A1* | 4/2020 | Liaw ................... H01L 27/0924 |
| 2020/0126987 | A1 | 4/2020 | Rubin |

FOREIGN PATENT DOCUMENTS

| | | |
|---|---|---|
| GB | 2603283 A | 8/2022 |
| JP | 2022105298 A | 7/2022 |

* cited by examiner

NANOSHEET TRANSISTORS WITH WRAP AROUND CONTACT

BACKGROUND

The present invention relates to semiconductor structures, and more specifically, to forming nanosheet transistors on bulk material.

Fin field effect transistors (FinFETs) are an emerging technology which may provide solutions to field effect transistor (FET) scaling problems at, and below, the 22 nm node. FinFET structures may include at least a narrow semiconductor fin gated on at least two sides of each of the semiconductor fin, as well as a source region and a drain region adjacent to the fin on opposite sides of the gate. FinFET structures having n-type source and drain regions may be referred to as nFinFETs, and FinFET structures having p-type source and drain regions may be referred to as pFinFETs.

The degree of control of electronic transport in the channel region of a field effect transistor is a predominant factor determining the level of leakage currents. A wrap-all-around gate, such as in a nanosheet field effect transistor, is a configuration that enhances control of the electronic transport in the channel region of a field effect transistor. However, integration schemes employ a semiconductor-on-insulator (SOI) substrate increase the cost of production because SOI substrates are more expensive than bulk substrates.

SUMMARY

An embodiment includes a method of forming a semiconductor device. The method may include forming a source/drain on an exposed portion of a semiconductor layer of a layered nanosheet, wherein the layered nanosheet comprises a plurality of layers. The method may include forming a sacrificial material on the source/drain. The method may include forming a dielectric layer covering the sacrificial material. The method may include removing the sacrificial material to form a contact void. The method may include depositing a contact liner into the contact void.

An embodiment includes a semiconductor device. The semiconductor device may include a first gate nanosheet stack. The semiconductor device may include a second gate nanosheet stack. The semiconductor device may include a first source/drain in contact with the first nanosheet stack. The semiconductor device may include a second source/drain in contact with the second nanosheet stack. The semiconductor device may include a source/drain dielectric located between the first source/drain and the second source/drain. The semiconductor device may include a contact liner in contact with the first source/drain, the second source/drain and the source/drain dielectric.

Figure 1:
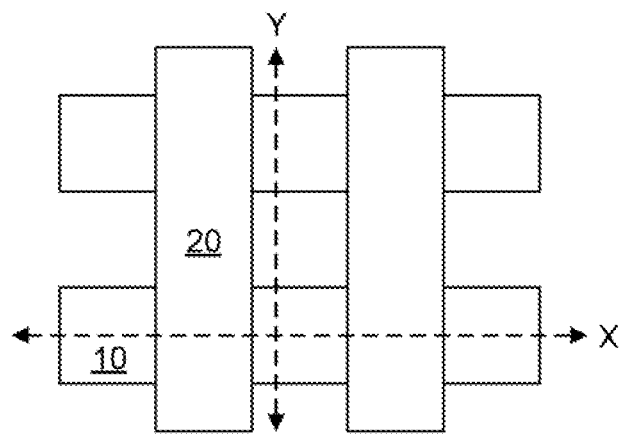
FIG. 1 depicts gates crossing a nanosheet stack with an x-axis and y-axis depicting the cross-sections used for the following figures, according to an exemplary embodiment

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements. The terms substantially, substantially similar, or about refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances, may have not been described in detail. In other instances, some processing steps or operations that are known in the art may not be described at all. It should be understood that the following description is rather focused on the distinctive features or elements of various embodiments of the present invention.

As continued CMOS scaling continues, there continues to be a trade-off between reducing contact resistance between the source/drain and the wiring of a chip (which may be accomplished by increasing the contact surface area between the elements) and reducing the gate-to-source/drain capacitance, which occurs as more metal (or conductive material) is located in source/drain regions. While wrap-around contact has been previously used, this can lead to higher gate-to-source/drain capacitance. Thus, an approach to minimize the excess conductive material in the source/drain region by using a sacrificial layer on source/drain to define the contact thickness of the contact material may be used, and therefore excess contact material may be replaced with a filler dielectric (which in turn reduces gate-to-source/drain capacitance).

Figure 2A:
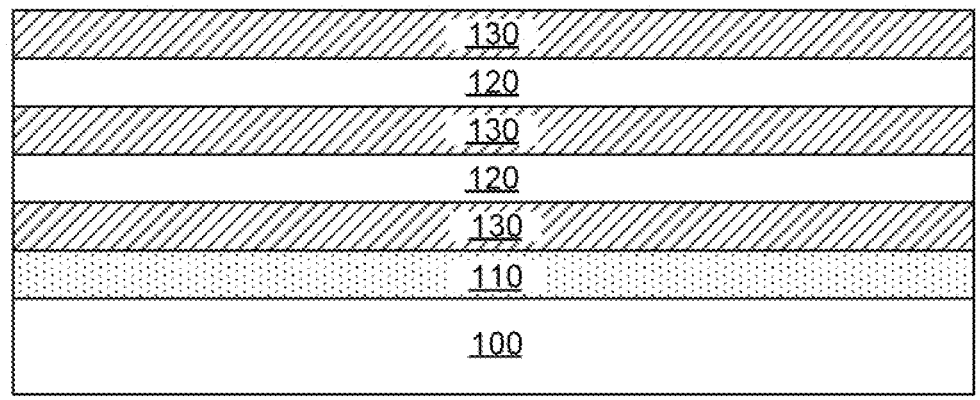
FIG. 2A depicts a cross sectional along view along the x-axis of a starting substrate, where the starting substrate has alternating layers of sacrificial material and semiconductor material, according to an exemplary embodiment.

Referring to FIGS. 2A&B, a semiconductor structure may be formed from a starting structure 10 having a layered configuration such as a substrate 100, an isolation layer 110, a semiconductor layer 120, and a sacrificial layer 130. Further, additional embodiments are contemplated having additional semiconductor layers, and sacrificial layers.

In some embodiments, the substrate 100 may be a bulk substrate. The substrate 100 may be made of any semiconductor material typically known in the art, including, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Additionally, the semiconductor layer 120 may be formed with the same types of material as the substrate 100. In some embodiments, the semiconductor layer 120 and may be the same material as the substrate 100.

Sacrificial layer 130 may contain material selected that may be selectively removed without damaging substrate 100, and semiconductor layer 120. In an example embodiment sacrificial layer 130 may be selected as silicon-germanium, while substrate 100 and semiconductor layer 120 contain silicon.

The starting material shown in FIGS. 2A&B may be achieved by epitaxially growing the materials on substrate 100, alternating between the sacrificial material and the semiconductor material. Sacrificial layer 130 may have a thickness ranging from 4 nm to approximately 10 nm. Semiconductor layer 120 may have a thickness ranging from 4 nm to approximately 10 nm.

Figure 2B:
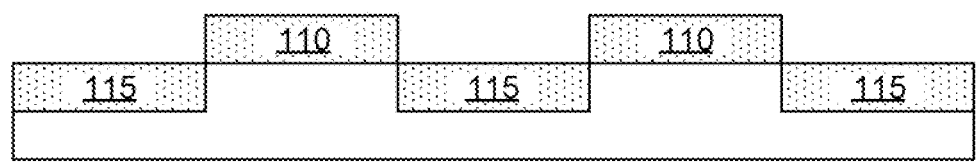
FIG. 2B depicts a cross sectional along view along the y-axis of a starting structure, where the starting structure has alternating layers of sacrificial material and semiconductor material formed into fins on a substrate with an STI separating each fin, according to an exemplary embodiment.

Isolation layer 110 may be an oxide of a SOI starting material, may be a dielectric following the replacement of a sacrificial material (such as a high Ge material capable of being selectively removed with respect to semiconductor layer 120 and sacrificial layer 130), or may be a dielectric formed from any other suitable means. Isolation layer 110 may include any suitable dielectric material, for example, silicon oxide, silicon nitride, hydrogenated silicon carbon oxide, silicon based low-k dielectrics, flowable oxides, porous dielectrics, or organic dielectrics including porous organic dielectrics and may be formed using any suitable deposition techniques including ALD, CVD, plasma enhanced CVD, spin on deposition, or PVD. However, in alternate embodiments, isolation layer 110 is not present, and sacrificial layer 130 is formed directly on substrate 100. With continued reference to FIG. 2B, an STI 115 separates each fin as illustrated.

Figure 3A:
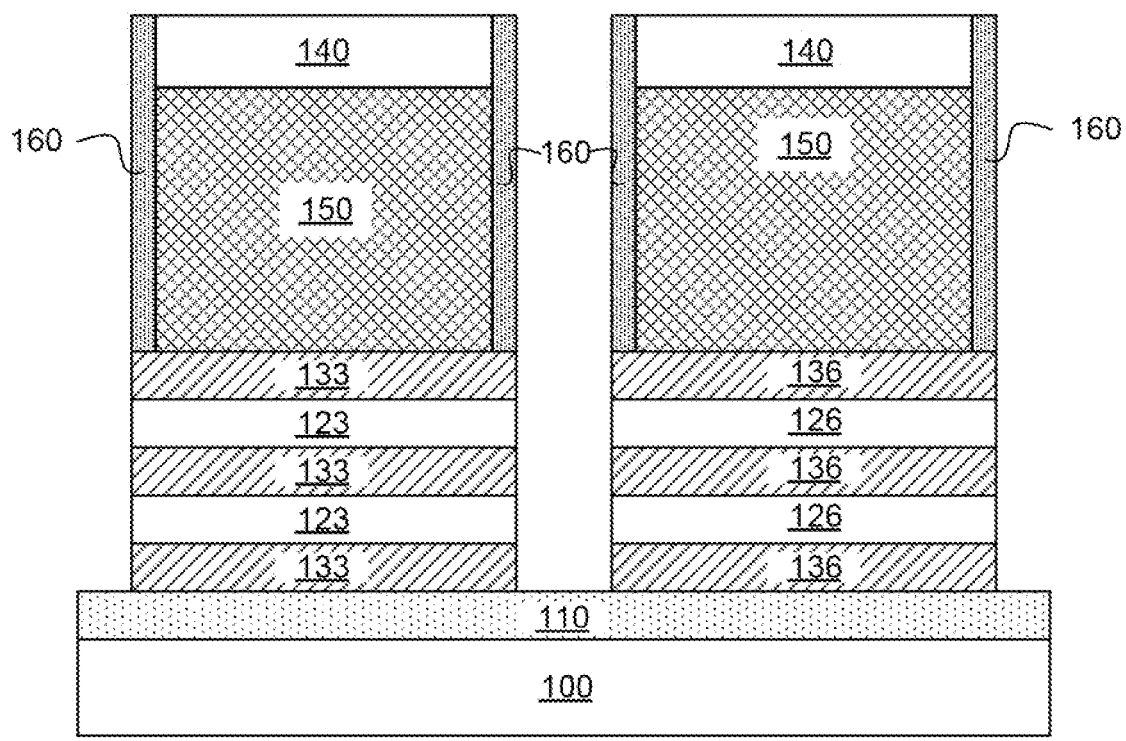
FIG. 3A depicts a cross sectional view along the x-axis of formation of dummy gates and gate spacers, according to an exemplary embodiment.
Figure 3B:
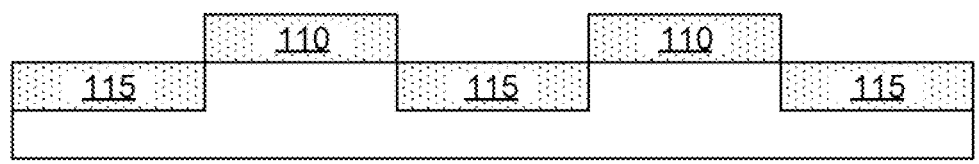
FIG. 3B depicts a cross sectional view along the y-axis of formation of dummy gates and gate spacers, according to an exemplary embodiment.

Referring to FIGS. 3A&B, dummy gates may be formed above the first structure 20 and the second structure 30. In forming the dummy gates, a dummy gate layer may be formed above the first structure 20 and the second structure 30 shown in FIGS. 3A&B. In such embodiments, the dummy gate layer may be made of any suitable sacrificial material, for example, amorphous or polycrystalline silicon. The dummy gate layer may have any thickness ranging from approximately 30 nm to approximately 200 nm. The dummy gate layer may be deposited by any suitable deposition technique known in the art, including atomic layer deposition (ALD), chemical vapor deposition (CVD), physical vapor deposition (PVD), molecular beam deposition (MBD), pulsed laser deposition (PLD), or liquid source misted chemical deposition (LSMCD).

Following deposition of the dummy gate layer a dummy gate structure, containing gate hardmask 140, dummy gate 150, and gate 160, may be formed. Formation of the dummy gate structure may be accomplished by lithographic patterning of the desired gate regions, using for example a gate hardmask 140 as a pattern, and subsequently etching away the dummy gate layer from the unpatterned areas. Suitable lithographic materials include, for example, a photoresist layer. Etching may be accomplished by any suitable technique, such as, for example, reactive ion etching (RIE) or wet stripping. Suitable materials for dummy gate 150 include, but are not limited to, ploy-silicon (poly-Si) and/or amorphous silicon (a-Si). A process such as CVD, ALD or PVD can be employed to deposit the sacrificial gate material over the nanosheet device stack 105. Suitable materials for the gate hardmask 140 include, but are not limited to, nitride hardmask materials such as SiN, SiON and/or SiCN, and/or oxide hardmask materials such as SiOx.

After formation of the dummy gate 150, gate spacer 160 may be formed surrounding the gate hardmask 140 and dummy gate 150. The gate spacer 160 may be made of any insulating material, such as silicon nitride, silicon oxide, silicon oxynitrides, or a combination thereof, and may have a thickness ranging from 2 nm to approximately 100 nm, preferably approximately 2 nm to approximately 25 nm. The spacers may be made of an insulating material, such as, for example, silicon nitride, silicon oxide, silicon oxynitrides, or a combination thereof. The gate spacer 160 may be formed by any method known in the art, including depositing a conformal silicon nitride layer over the dummy gate 150 and removing unwanted material from the conformal silicon nitride layer using an anisotropic etching process such as, for example, reactive ion etching (RIE) or plasma etching (not shown). Methods of forming spacers are well-known in the art and other methods are explicitly contemplated. Further, in various embodiments, the gate spacer 160 may include one or more layers.

Still referring to FIGS. 3A&B, an anisotropic etch may be performed to remove material between each dummy gate structures. Following the anisotropic etch, first gate sacrificial layer 133, second gate sacrificial layer 136, first gate semiconductor layer 123 and second gate semiconductor layer 126 only remain beneath the dummy gate structure. The anisotropic etch may be accomplished by any suitable technique, such as, for example, reactive ion etching (RIE).

Figure 4A:
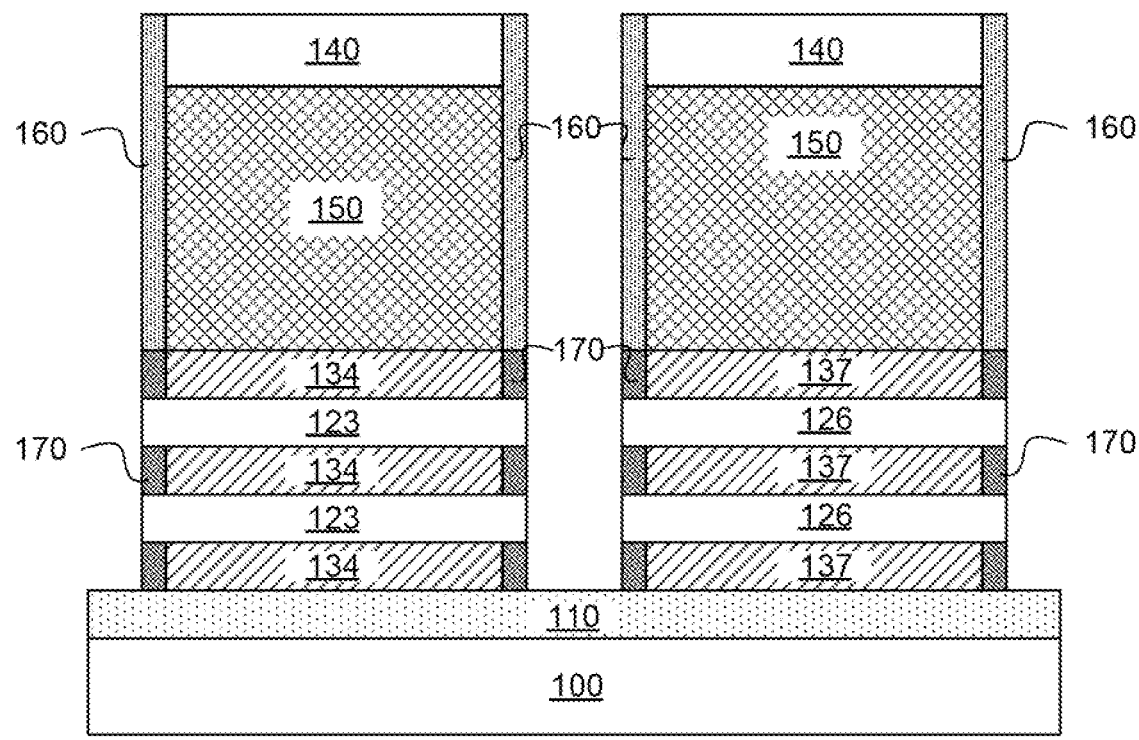
FIG. 4A depicts a cross sectional view along the x-axis of formation of spacers in the nanosheet region, according to an exemplary embodiment.
Figure 4B:
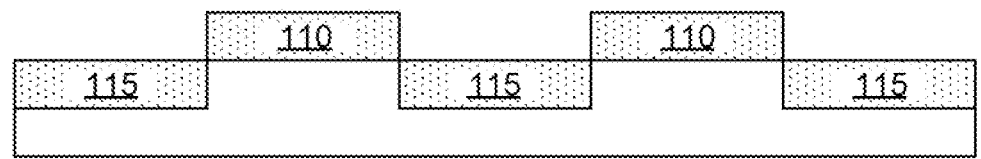
FIG. 4B depicts a cross sectional view along the y-axis of formation of spacers in the nanosheet region, according to an exemplary embodiment.

Referring to FIGS. 4A&B, an isotropic etch may be performed to pull back, or selectively remove, the material of the first gate sacrificial layer 133 and second gate sacrificial layer 136, while maintaining first gate semiconductor layer 123 and second gate semiconductor layer 126, forming a pulled back first gate sacrificial layer 134, and a pulled back second gate sacrificial layer 137. The pullback staggers the vertical interface created during the anisotropic etch such that the vertical interface of the pulled back first gate sacrificial layer 134, and the pulled back second gate sacrificial layer 137 is not the same as the vertical interface of first gate semiconductor layer 123 and second gate semiconductor layer 126. The isotropic etch may be accomplished by any suitable technique capable of selectively removing, first gate sacrificial layer 133, second gate sacrificial layer 136, such as, for example, wet and dry etching techniques.

Still referring to FIGS. 4A&B, inner spacers 170 are formed. The inner spacers 170 may be formed by conformal deposition of an insulating material on the exposed surfaces of the structure. Further, in various embodiments, the inner spacers 170 may include one or more layers. The inner spacers 170 may be any suitable oxide, nitride or oxynitride material, such as silicon nitride.

Removal of the insulating layer covering first gate semiconductor layer 123 and second gate semiconductor layer 126 may be accomplished through any combination of known techniques, such as, for example, RIE, wet stripping and plasma etching. Due to the anisotropic nature of the etch, inner spacers 170 are retained along a pulled back first gate sacrificial layer 134 and a pulled back second gate sacrificial layer 137.

Figure 5A:
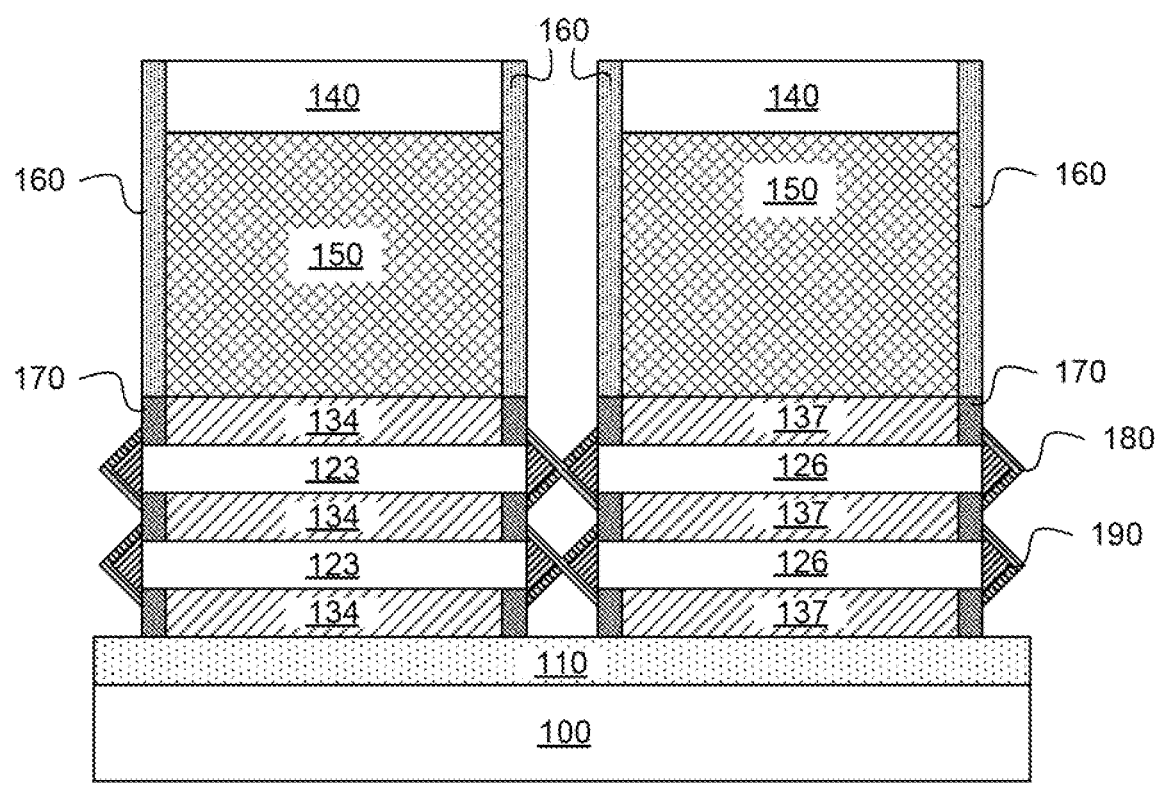
FIG. 5A depicts a cross sectional view along the x-axis of formation of the source/drain and sacrificial source/drain material, according to an exemplary embodiment.
Figure 5B:
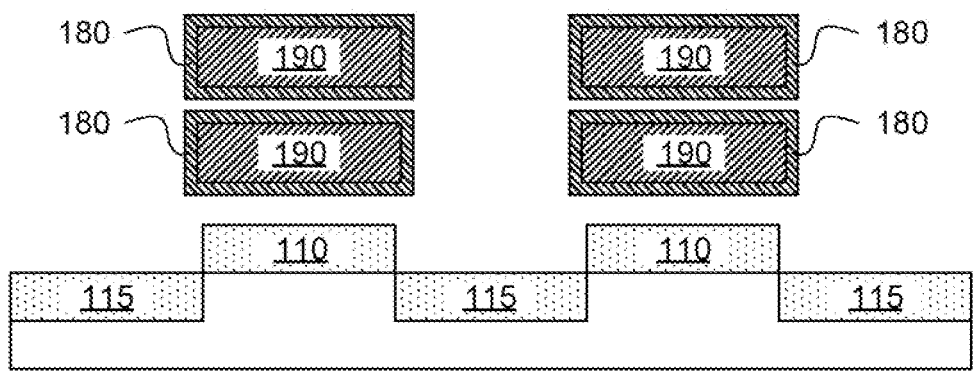
FIG. 5B depicts a cross sectional view along the y-axis of formation of the source/drain and sacrificial source/drain material, according to an exemplary embodiment.

Referring to FIGS. 5A&B, source/drain 190 may be formed on the exposed surfaces first gate semiconductor layer 123 and second gate semiconductor layer 126 using epitaxial growth, and a sacrificial source/drain layer 180 may be formed on the source/drain 190. The source/drain 190 may be formed such that the surface of the source/drain 190 in contact with the seed layer (i.e., first gate semiconductor layer 123 and second gate semiconductor layer 126) is slightly larger than the seed layer. Additionally, as epitaxial growth is used, a {111} plane may be created, and the growth may be stopped so the source/drain 190 formed from first gate semiconductor layer 123 is not in contact with the source/drain 190 formed from second gate semiconductor layer 126 or merge consecutive semiconductor layers of the nanosheet, thus resulting in the triangular cross section depicted in FIGS. 5A&B. However, in some embodiments, the source/drain 190 may be grown together, but not so much as to fully fill in the space between the first and the second gate or merge the source/drain of each semiconductor layer of the nanosheet so that there are no voids between structures of the source/drain 190. In some embodiments, source/drain 190 may be silicon-germanium. In such an embodiment, the semiconductor material may contain, for example, approximately 20% to approximately 100% germanium, approximately 0% to approximately 80% silicon, and may be doped with p-type dopants such as boron in concentrations ranging from approximately $1\times10^{20}$ atoms/$cm^3$ to approximately $2\times10^{21}$ atoms/$cm^3$. In another example embodiment, the semiconductor material may be carbon doped silicon. In such an embodiment, the semiconductor material may contain, for example, approximately 0.5% to approximately 2.5% carbon, approximately 97.5% to approximately 99.5% silicon, and may be doped with n-type dopants such as arsenic or phosphorus in concentrations ranging from approximately $1\times10^{20}$ atoms/$cm^3$ to approximately $2\times10^{21}$ atoms/$cm^3$. Removal of the masking layer 180 and the portion of the second region masking layer 183 may occur following, epitaxial growth. Sacrificial source/drain layer 180 may be epitaxially grown on the surface of the source/drain 190. The material of sacrificial source/drain layer 180 may be selected so that it may be selectively removed with respect to source/drain 190 at a later step. Sacrificial source/drain layer 180 may have a thickness of about 1 to about 10 nm.

The terms "epitaxial growth and/or deposition" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

Figure 6A:
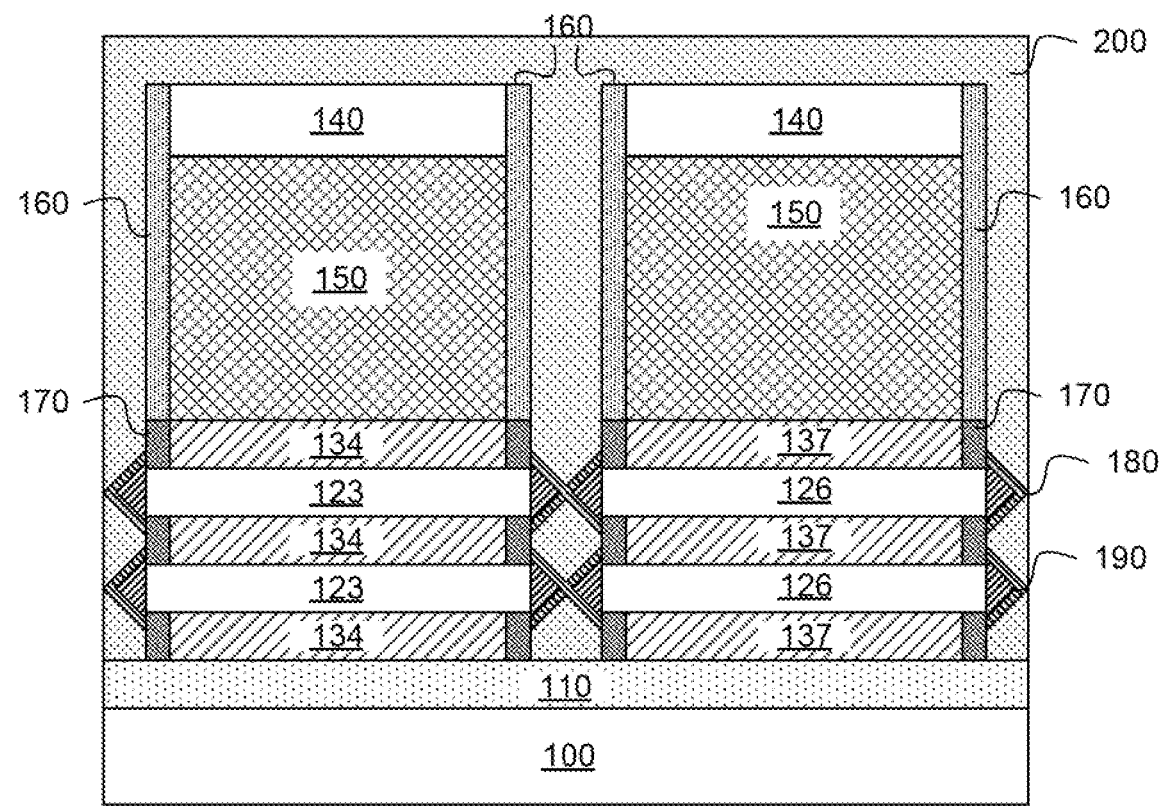
FIG. 6A depicts a cross sectional view along the x-axis of deposition of a dielectric layer, according to an exemplary embodiment.
Figure 6B:
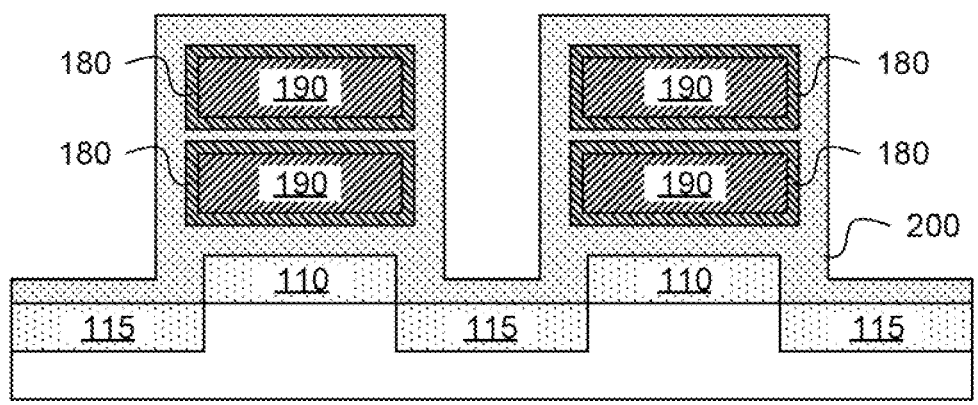
FIG. 6B depicts a cross sectional view along the y-axis of deposition of a dielectric layer, according to an exemplary embodiment.

Referring to FIGS. 6A&B, a conformal deposition of a source/drain dielectric layer 200 may be performed. The source/drain dielectric layer 200 may be made of any insulating material, such as silicon nitride, silicon oxide, silicon oxynitrides, or a combination thereof. In an example embodiment, SiBCN may be selected as the source/drain dielectric layer 200. The source/drain dielectric layer 200 may be formed by any method known in the art, including conformal deposition. The source/drain dielectric layer 200 may be in contact with the inner spacers 170 in order to attach and stabilize the source/drain dielectric layer 200 in between gate structures.

Figure 7A:
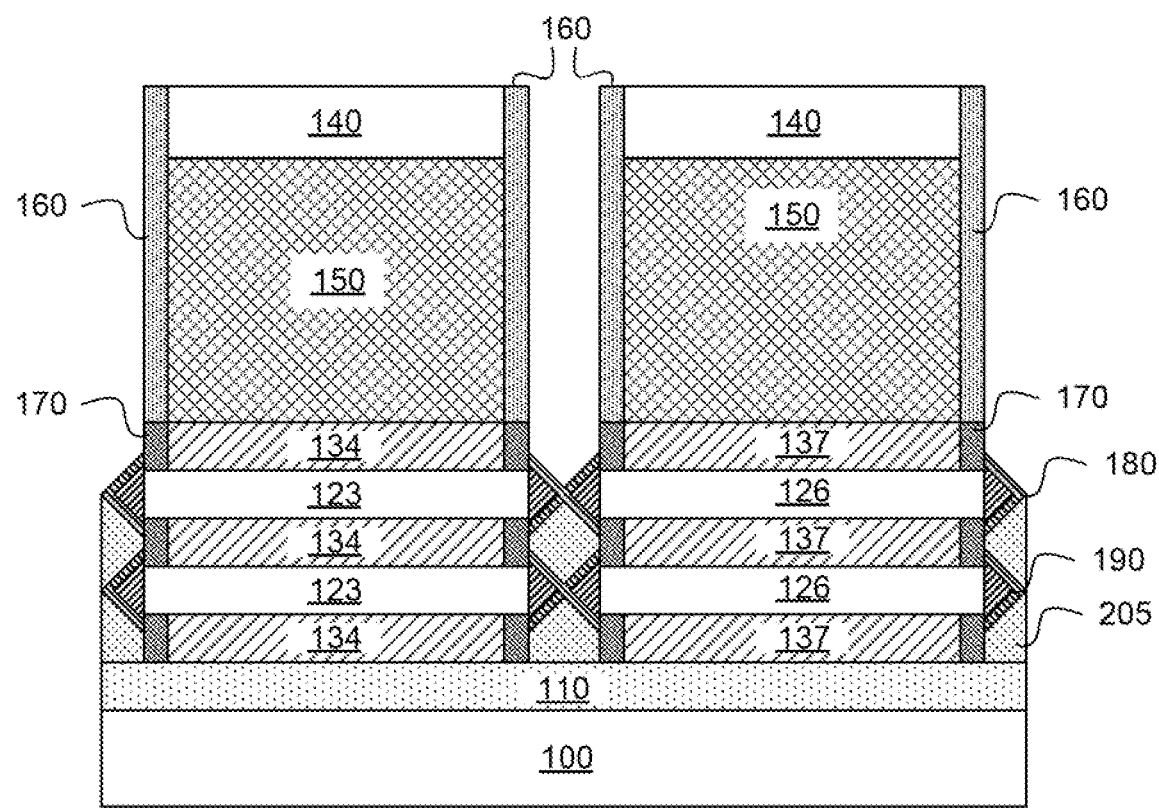
FIG. 7A depicts a cross sectional view along the x-axis of formation of a source/drain dielectric, according to an exemplary embodiment.
Figure 7B:
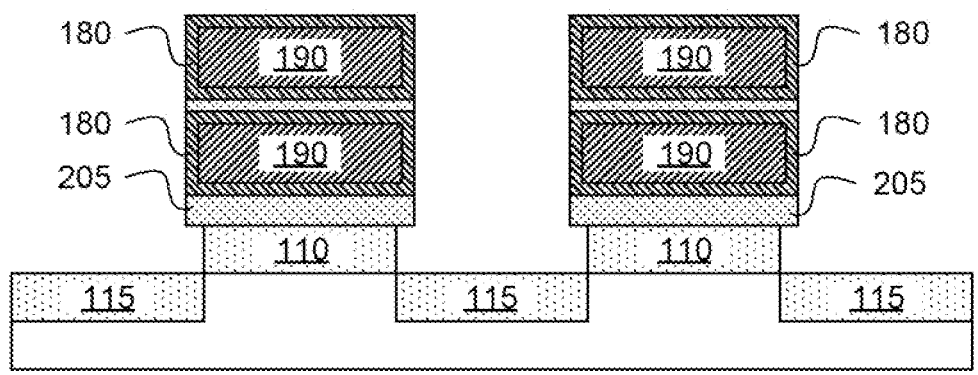
FIG. 7B depicts a cross sectional view along the y-axis of formation of a source/drain dielectric, according to an exemplary embodiment.

Referring to FIGS. 7A&B, source/drain dielectric layer 200 may be reduced to beneath the sacrificial source/drain 180, forming source/drain dielectric layer 205. Removing material from the previous conformal process may be performed using an isotropic etch suitable for the material.

Figure 8A:
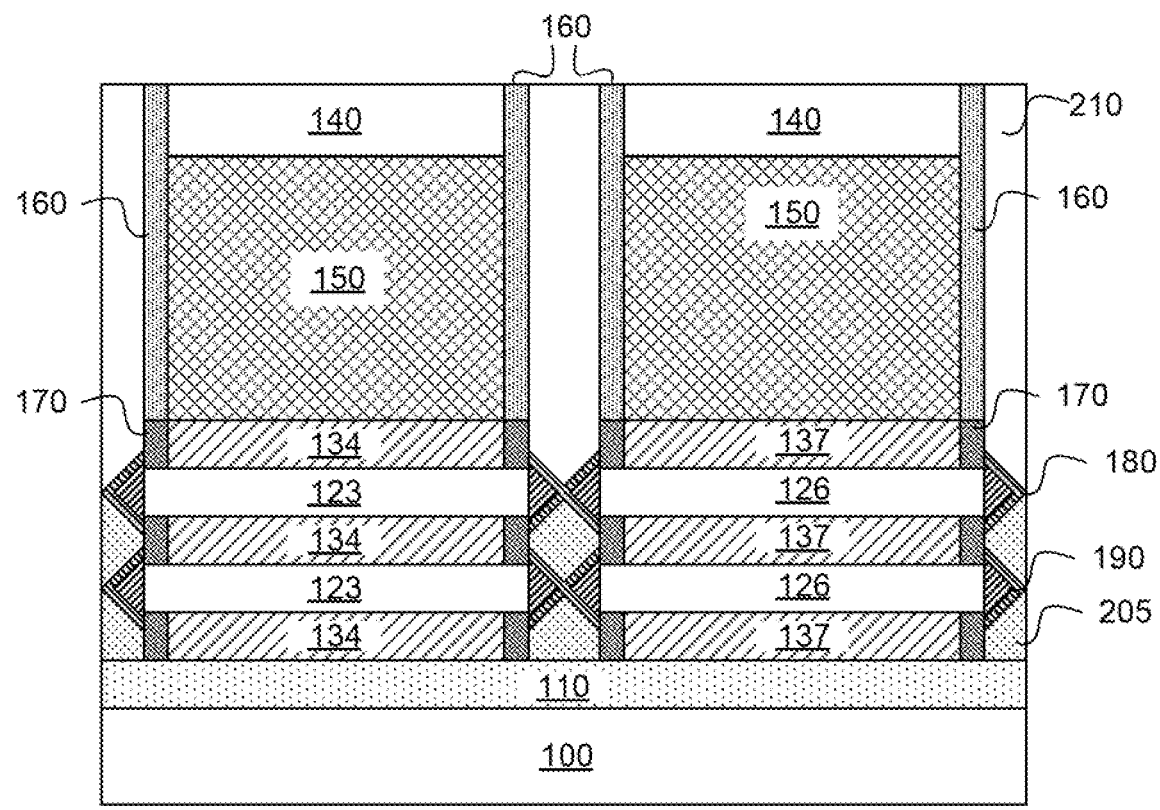
FIG. 8A depicts a cross sectional view along the x-axis of depositing an interlayer dielectric, according to an exemplary embodiment.
Figure 8B:
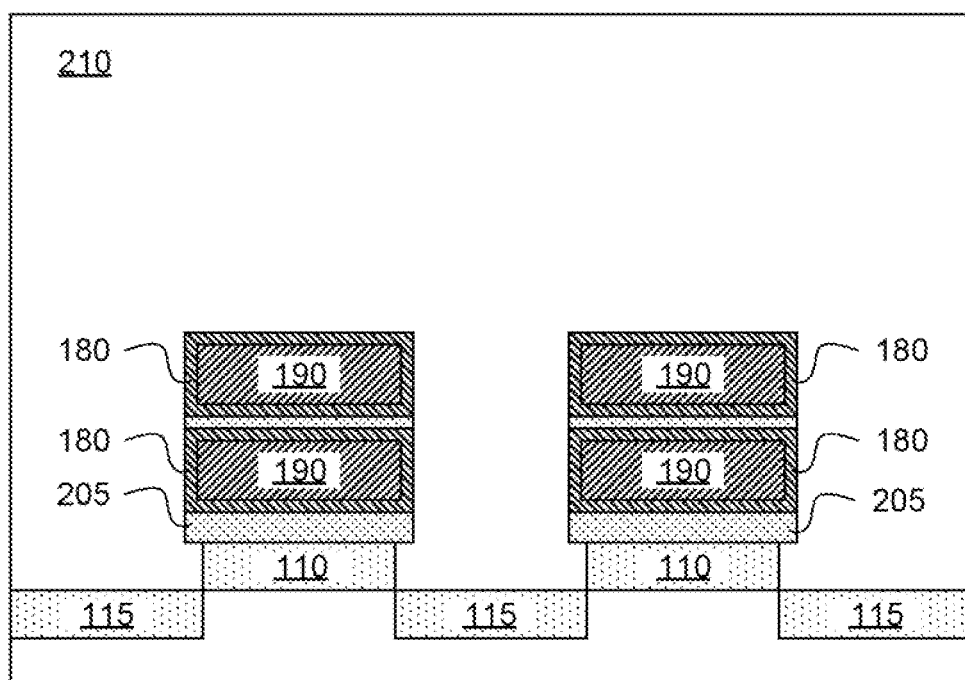
FIG. 8B depicts a cross sectional view along the y-axis of depositing an interlayer dielectric, according to an exemplary embodiment.

Referring to FIGS. 8A&B, an interlayer dielectric (ILD) 210 may be formed surrounding the gates. Suitable ILD materials include, but are not limited to, oxide low-κ materials such as silicon oxide (SiOx) and/or oxide ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH). A process such as CVD, ALD or PVD can be employed to deposit ILD 210. Following deposition, ILD 210 can be planarized using a process such as chemical mechanical polishing (CMP).

Figure 9A:
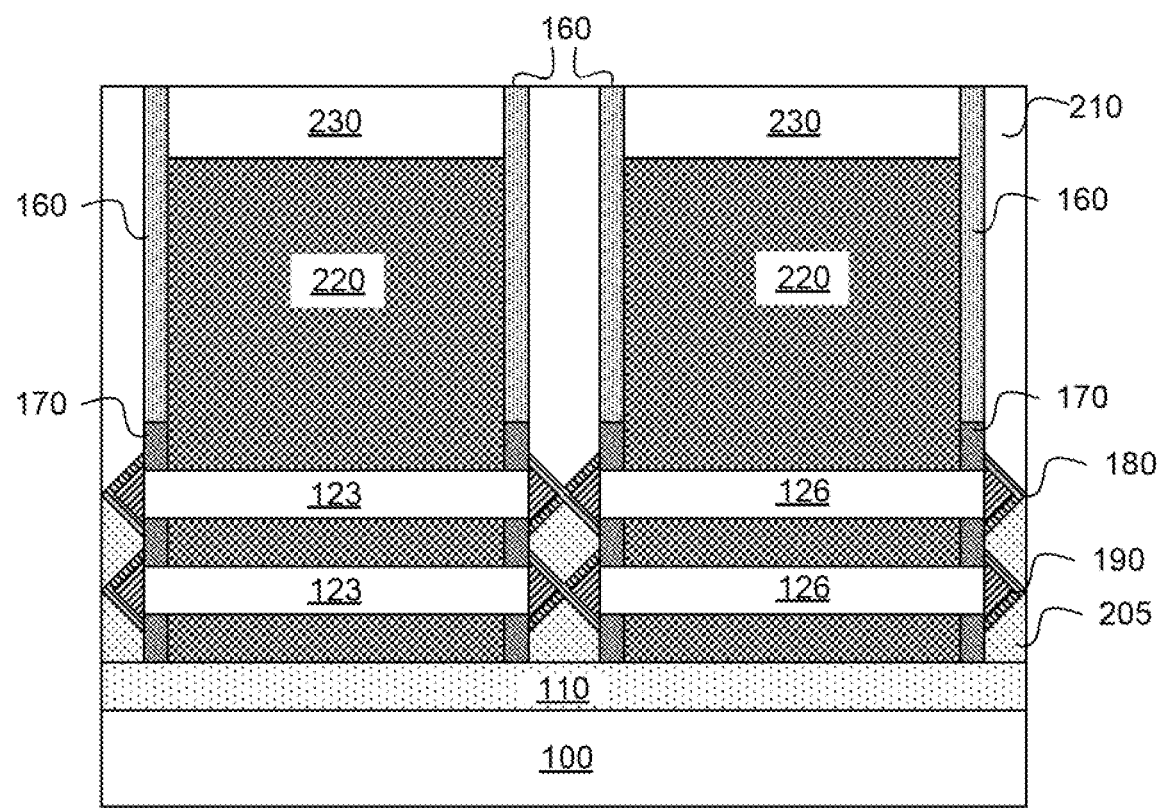
FIG. 9A depicts a cross sectional view along the x-axis of forming replacement metal gates, according to an exemplary embodiment.
Figure 9B:
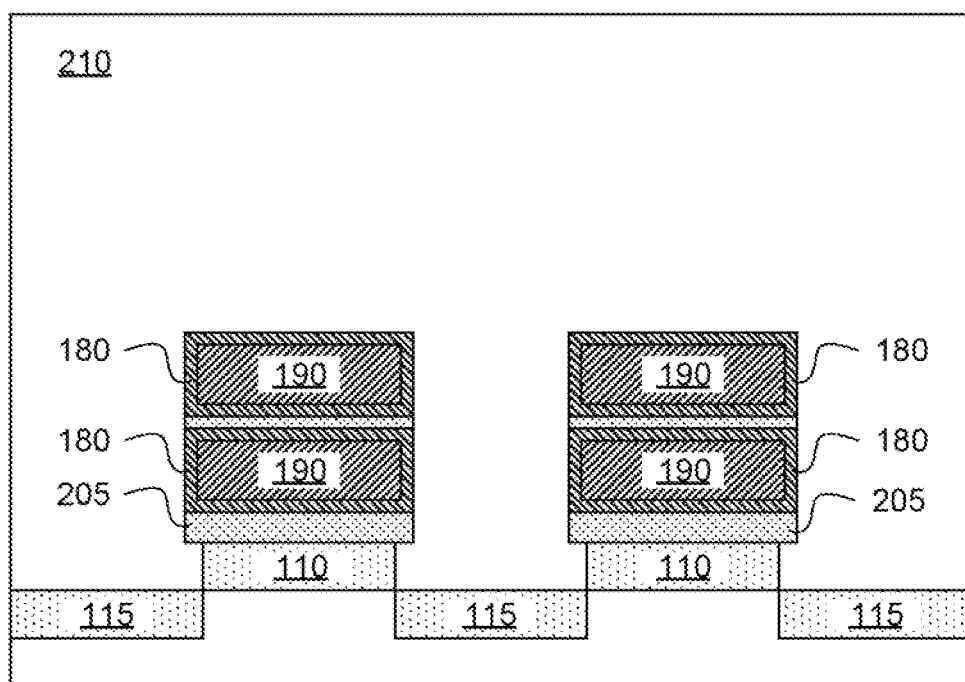
FIG. 9B depicts a cross sectional view along the y-axis of forming replacement metal gates, according to an exemplary embodiment.

Referring to FIGS. 9A&B, the sacrificial gates 150, pulled back first gate sacrificial layer 134, and pulled back second gate sacrificial layer 137 may be removed and replaced with a replacement metal gate (RMG) 220. Dummy gate 150 may be removed by any suitable etching process known in the art capable of selectively removing the dummy gate 150 without substantially removing material from the surrounding structures. In an exemplary embodiment, the dummy gate 150 may be removed, for example, by a reactive ion etching (RIE) process capable of selectively removing silicon.

Still referring to FIGS. 9A&B, selective removal of the pulled back first gate sacrificial layer 134 and the pulled back second gate sacrificial layer 137 may occur. Any suitable etching process known in the art capable of selectively removing the material in the pulled back first gate sacrificial layer 134 and the pulled back second gate sacrificial layer 137, while retaining the material in first gate semiconductor layer 123 and second gate semiconductor layer 126 may be used, and selection of the etching process may be dependent on the specific materials considered.

Still referring to FIGS. 9A&B, an RMG 220 may be formed in the void. Forming RMG 220 may include depositing a dielectric, a work function metal, and a gate electrode. In one embodiment, the dielectric layer may include silicon oxide ($Si_xO_y$) or a high-k oxide such as, for example, hafnium oxide ($Hf_xO_y$), zirconium oxide ($Zr_xO_y$), aluminum oxide ($Al_xO_y$), titanium oxide ($Ti_xO_y$), lanthanum oxide ($La_xO_y$), strontium titanium oxide ($Sr_xTi_yO_z$), lanthanum aluminum oxide ($La_xAl_yO_z$), and mixtures thereof. The dielectric layer may be deposited using any suitable deposition technique known the art, including, for example, atomic layer deposition (ALD), chemical vapor deposition (CVD), physical vapor deposition (PVD), molecular beam deposition (MBD), pulsed laser deposition (PLD), or liquid source misted chemical deposition (LSMCD).

Following the deposition of the dielectric layer, in some embodiments a work function metal layer may be deposited. The work function metal layer may include, for example, aluminum, lanthanum oxide, magnesium oxide, strontium titanate, strontium oxide, TiN, TaN. The work function metal layer may be formed using any suitable metal deposition technique, including, for example, CVD, PVD, and ALD, sputtering, and plating. In some embodiments, a high temperature anneal may be performed prior to the deposition of the gate electrode.

A gate electrode may be deposited above the dielectric layer or work function layer. The gate electrode may be made of gate conductor materials including, but not limited to, zirconium, tungsten, tantalum, hafnium, titanium, aluminum, ruthenium, metal carbides, metal nitrides, transition metal aluminides, tantalum carbide, titanium carbide, tantalum magnesium carbide, or combinations thereof. The gate electrode may be formed using any suitable metal deposition technique, including, for example, CVD, PVD, and ALD, sputtering, and plating. Additionally, a sacrificial cap 230 may fill the rest of the gate opening. The sacrificial cap 230 may be formed using any suitable deposition techniques including ALD, CVD, plasma enhanced CVD, spin on deposition, or PVD. The sacrificial cap 230 may include any suitable dielectric material, for example, silicon oxide, silicon nitride, hydrogenated silicon carbon oxide, silicon based low-k dielectrics, flowable oxides, porous dielectrics, or organic dielectrics including porous organic dielectrics. Following formation of RMG 220, a sacrificial cap 230 may be formed using any suitable dielectric.

Figure 10A:
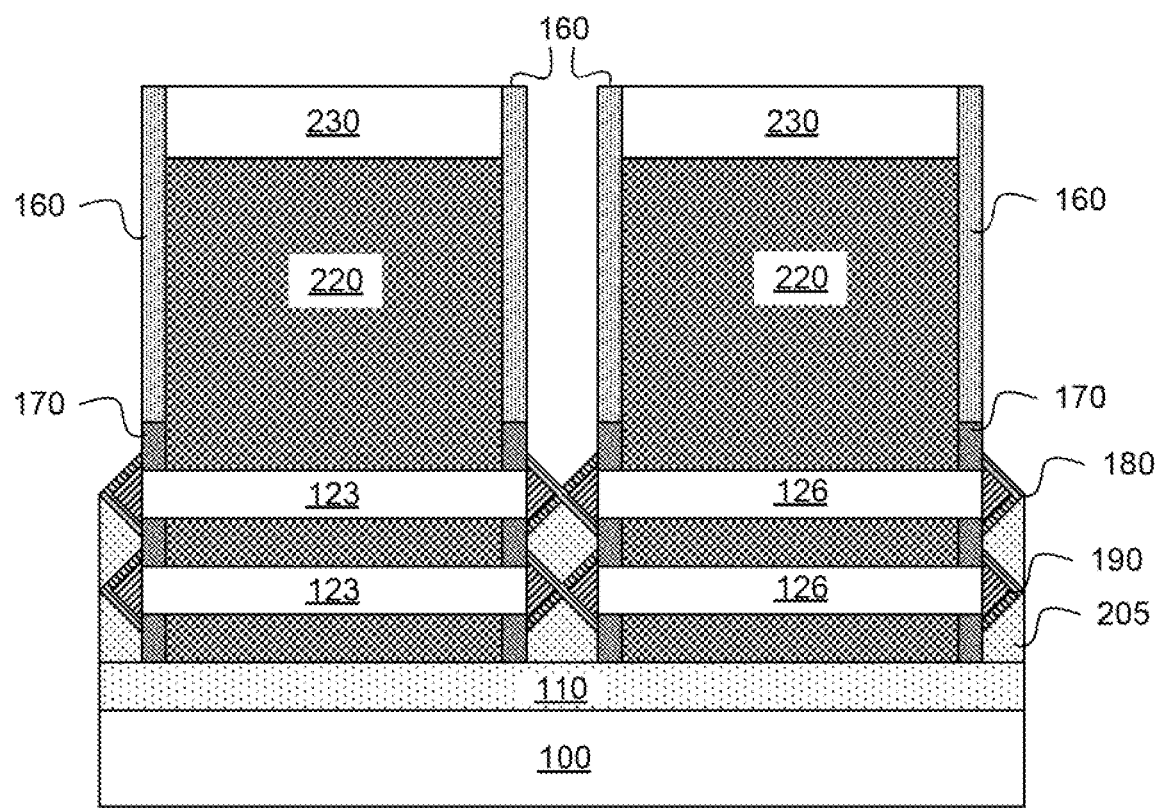
FIG. 10A depicts a cross sectional view along the x-axis of removing the interlayer dielectric, according to an exemplary embodiment.
Figure 10B:
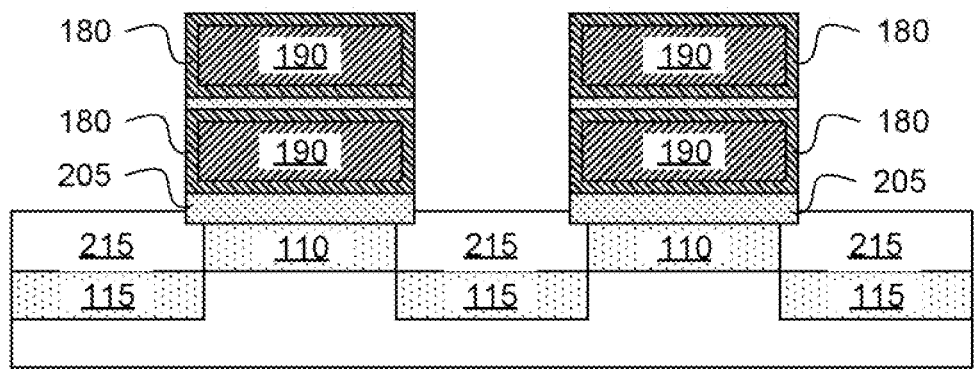
FIG. 10B depicts a cross sectional view along the y-axis of removing the interlayer dielectric, according to an exemplary embodiment.

Referring to FIGS. 10A&B, the ILD 210 may be recessed to expose the sacrificial source/drain layer 180. Recessing ILD 210 may be performed using any suitable etching technique such as, for example, a reactive ion etching (RIE). After recessing, ILD portions 215 remain.

Figure 11A:
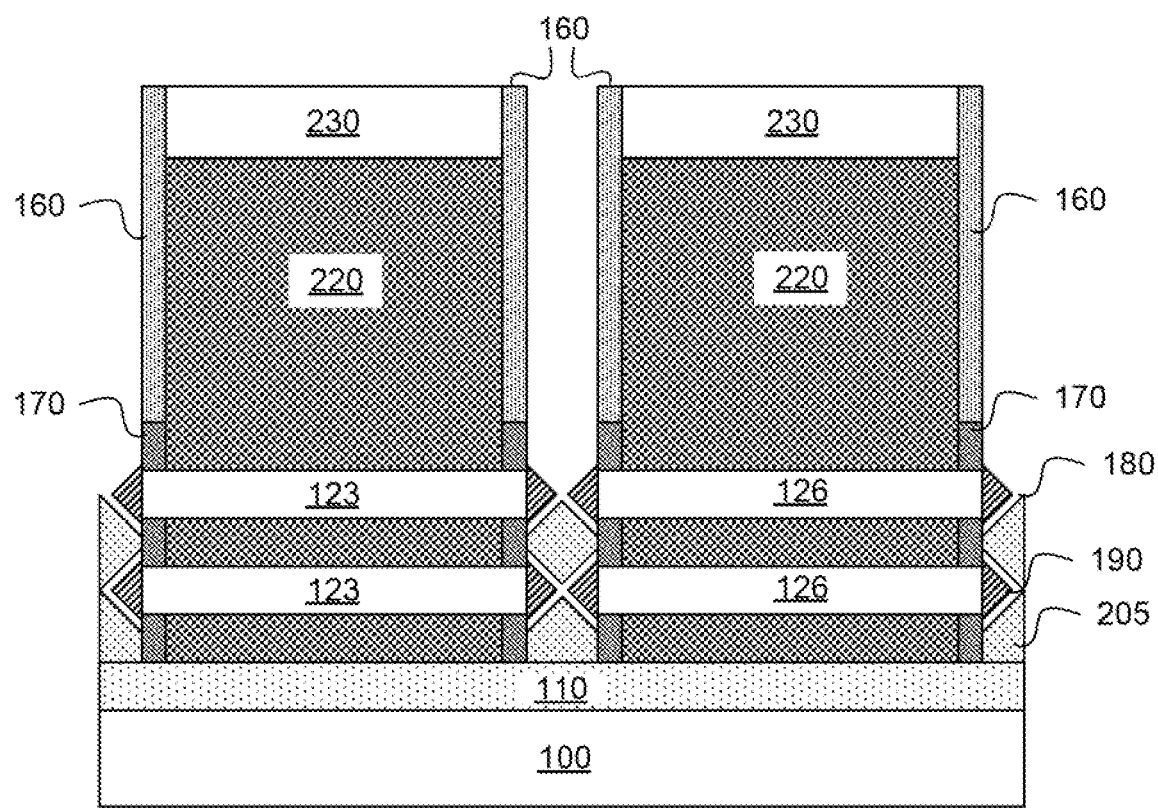
FIG. 11A depicts a cross sectional view along the x-axis of removing the sacrificial source/drain layer, according to an exemplary embodiment.
Figure 11B:
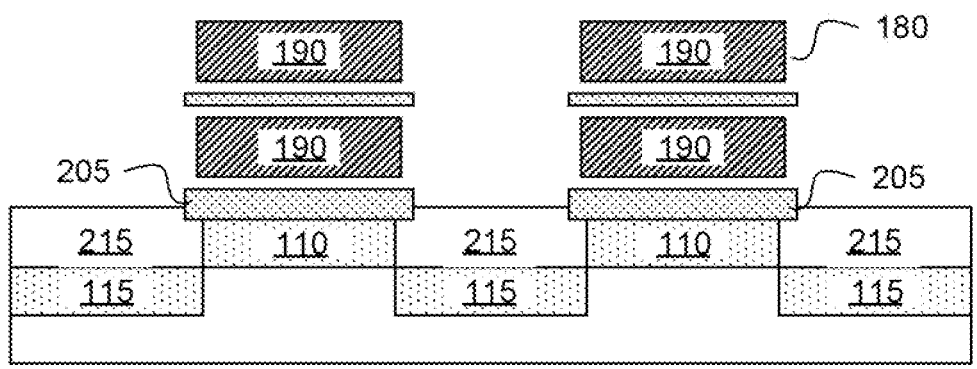
FIG. 11B depicts a cross sectional view along the y-axis of removing the sacrificial source/drain layer, according to an exemplary embodiment.

Referring to FIGS. 11A&B, sacrificial source/drain layer 180 may be selectively removed, leaving a gap between source/drain 190 and source/drain dielectric 205. Sacrificial source/drain layer 180 may be selectively removed using any suitable etching technique, based on the chemistry of sacrificial source/drain layer 180 and source/drain 190.

Figure 12A:
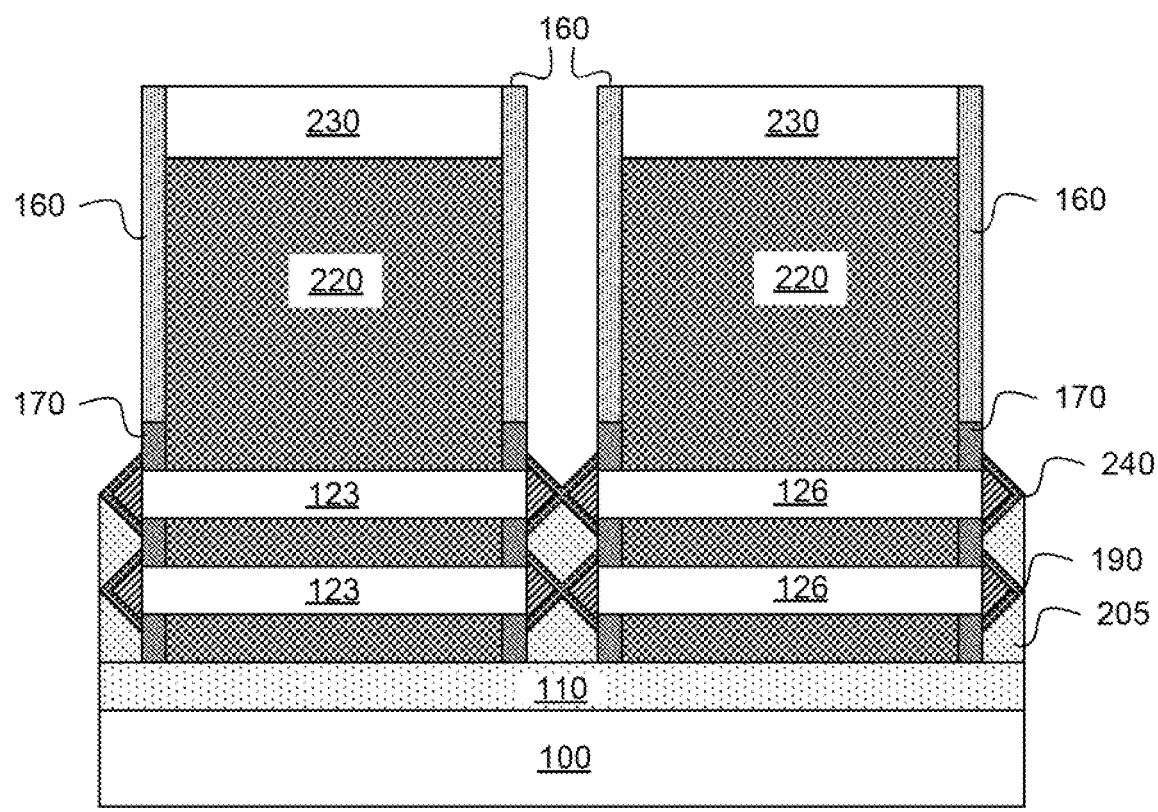
FIG. 12A depicts a cross sectional view along the x-axis of forming a contact liner, according to an exemplary embodiment.
Figure 12B:
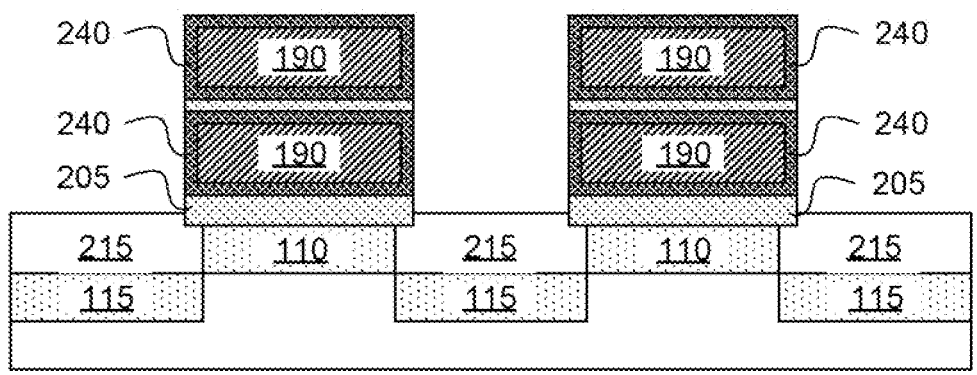
FIG. 12B depicts a cross sectional view along the y-axis of forming a contact liner, according to an exemplary embodiment.

Referring to FIGS. 12A&B, a contact liner 240 may be formed in the gap created during the removal of the sacrificial source/drain layer 180. A metal liner may be conformally deposited, followed by silicidation of the metal with the source/drain, to for the contact liner 240. The metal liner may include metals such as, for example, Co, Ti, Ni, W, Mo, and Ta.

Figure 13A:
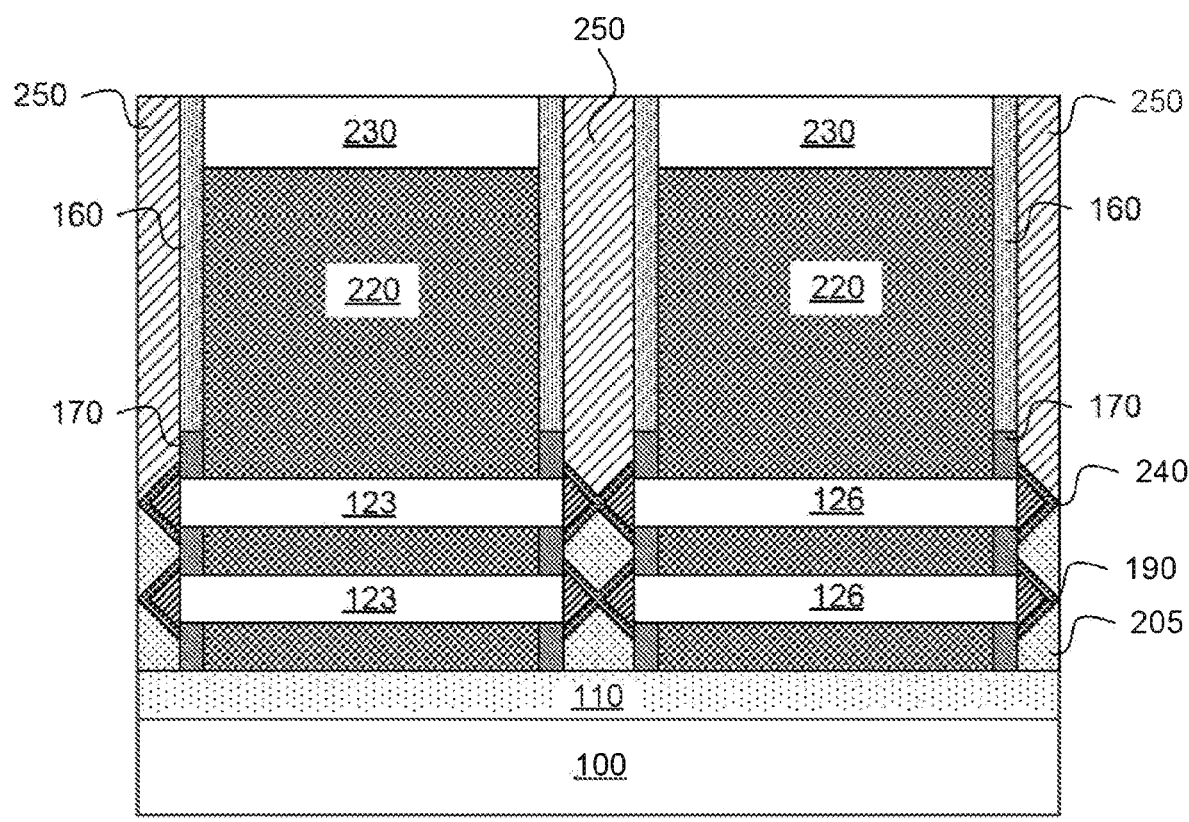
FIG. 13A depicts a cross sectional view along the x-axis of forming electrical contacts, according to an exemplary embodiment.
Figure 13B:
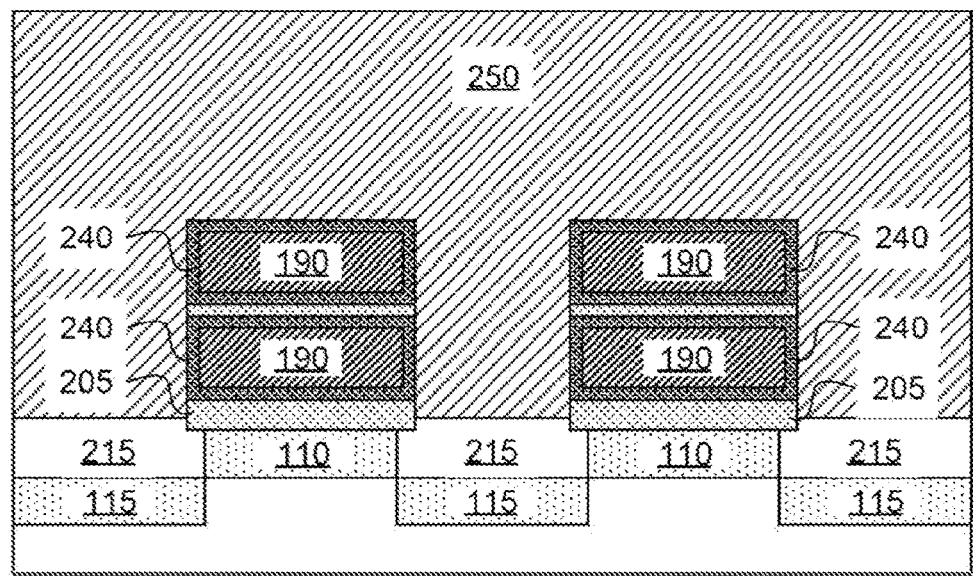
FIG. 13B depicts a cross sectional view along the y-axis of forming electrical contacts, according to an exemplary embodiment.

Referring to FIGS. 13A&B, electrical contacts 250 may be deposited. The electrical contacts 250 may be deposited in the source/drain region. Electrical contacts 250 may include, for example, copper, aluminum, titanium nitride, tantalum nitride or tungsten. The electrical contacts 250 may be formed using a filing technique such as electroplating, electroless plating, chemical vapor deposition, physical vapor deposition or a combination of methods.

Following the steps above, a device may be formed having reduced contact resistance (by increasing the contact surface area) while also having reduced gate-to-source/drain capacitance. The structure that is formed includes a source drain 190 that is not fully merged with other portions of the source/drain 190 on consecutive semiconductor layers (e.g., first gate semiconductor layer 123), or on semiconductor layers on opposite devices (e.g., first gate semiconductor layer 123 and second gate semiconductor layer 126). A layer of a contact liner 240 is located on the surface of the source/drain 190, which may maintain a high contact area that is indicative of a wrap-around-contact. The contact liner 240 may have a uniform, or substantially uniform, thickness around each source/drain 190, and the rest of the area in the source/drain region is filled with a source/drain dielectric 205. Source/drain dielectric 205 reduces the total volume that could be filled by contact liner 240, while contact liner 240 still achieves a similar contact surface area as there was a complete fill of the region with the contact liner 240. This may reduce the overall gate-to-source/drain capacitance of a wrap-around-contact by reducing the unnecessary conductive material in the source/drain region, and thereby reducing the capacitance created by that region.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A semiconductor structure comprising:
   a first nanosheet stack;
   a second nanosheet stack;
   a first source/drain in contact with the first nanosheet stack;
   a second source/drain in contact with the second nanosheet stack;
   a source/drain dielectric located between the first source/drain and the second source/drain, wherein the source/drain dielectric is in contact with an inner spacer positioned between two adjacent nanosheets of the first nanosheet stack; and
   a contact liner in contact with the first source/drain, the second source/drain and the source/drain dielectric.

2. The structure of claim 1, wherein a thickness of the contact liner is about 1 to about 10 nm.

3. The structure of claim 1, wherein the first source/drain comprises at least a first portion on a first nanosheet layer of the first nanosheet stack and a second portion on a second nanosheet layer of the first nanosheet stack, wherein the first portion of the first source/drain is separate and apart from the second portion of the first source/drain.

4. The structure of claim 1, wherein the first source/drain is in contact with the second source/drain.

5. The structure of claim 1, wherein the first source/drain is not in contact with the second source/drain.

6. The structure of claim 5, wherein the contact liner is a contiguous layer in contact with the first source/drain and the second source/drain.

7. A method of forming a semiconductor device, the method comprising:
   forming a source/drain on an exposed portion of a semiconductor layer of a layered nanosheet, wherein the layered nanosheet comprises a plurality of layers;
   forming a sacrificial material directly on the source/drain;
   forming a dielectric layer covering the sacrificial material;
   removing the sacrificial material to form a contact void; and
   depositing a contact liner into the contact void and directly on the source/drain.

8. The method of claim 7, wherein a material of the contact liner comprises a silicide.

9. The method of claim 7, wherein a thickness of the contact liner is about 1 to about 10 nm.

10. The method of claim 7, wherein a portion of the source/drain on a layer of the plurality of layers is not in contact with a portion of the source/drain on an adjacent layer of the plurality of layers.

11. The method of claim 7, wherein the dielectric layer is in contact with an inner spacer positioned between two adjacent nanosheets of the layered nanosheet.

12. A method of forming a semiconductor device, the method comprising:
    forming a first gate stack and a second gate stack on a substrate, wherein the first gate stack and the second gate stack each comprise a plurality of semiconductor nanosheets;
    forming a first source/drain on a first surface of a first semiconductor layer of the first gate stack and a second source/drain on a second surface of a second semiconductor layer of the second gate stack, wherein the first surface and the second surface face each other;
    forming a sacrificial material on the first source/drain and the second source/drain;
    forming a dielectric layer covering the sacrificial material;
    removing the sacrificial material to form a contact void; and
    depositing a contact liner into the contact void.

13. The method of claim 12, wherein a material of the contact liner comprises a silicide.

14. The method of claim 12, wherein a thickness of the contact liner is about 1 to about 10 nm.

15. The method of claim 12, wherein a portion of the first source/drain on a nanosheet of the plurality of semiconductor nanosheets is not in contact with a portion of the first source/drain on an adjacent nanosheet of the plurality of semiconductor nanosheets.

16. The method of claim 12, wherein the dielectric layer is in contact with an inner spacer positioned between two adjacent nanosheets of the first gate stack.

17. The method of claim 12, wherein the first source/drain is not in contact with the second source/drain.

18. The method of claim 17, wherein the contact liner is a contiguous layer in contact with the first source/drain and the second source/drain.

19. The method of claim 12, wherein the first source/drain is in contact with the second source/drain.

* * * * *